(12) United States Patent
Hirose et al.

(10) Patent No.: US 7,026,261 B2
(45) Date of Patent: Apr. 11, 2006

(54) METHOD FOR FABRICATING SEMICONDUCTOR DEVICE

(75) Inventors: Yutaka Hirose, Kyoto (JP); Tsuyoshi Tanaka, Osaka (JP); Daisuke Ueda, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 40 days.

(21) Appl. No.: 10/861,464

(22) Filed: Jun. 7, 2004

(65) Prior Publication Data

US 2005/0026393 A1 Feb. 3, 2005

(30) Foreign Application Priority Data

Jun. 16, 2003 (JP) .............................. 2003-170301

(51) Int. Cl.
*H01L 21/26* (2006.01)

(52) U.S. Cl. ..................................................... 438/795

(58) Field of Classification Search ................. 438/795
See application file for complete search history.

(56) References Cited

U.S. PATENT DOCUMENTS 6,071,795 A * 6/2000 Cheung et al. ............. 438/458
6,750,158 B1 * 6/2004 Ogawa et al. .............. 438/795

* cited by examiner

*Primary Examiner*—W. David Coleman
*Assistant Examiner*—Nicholas J. Tobergte
(74) *Attorney, Agent, or Firm*—McDermott Will & Emery LLP

(57) ABSTRACT

A semiconductor layer formed on one surface of a substrate is irradiated with light from the other surface of the substrate to thermally decompose part of a region of the semiconductor layer in contact with the substrate, thereby forming a thermally decomposed layer. Thereafter, the thermally decomposed layer is removed with the substrate kept bonded with the semiconductor layer.

10 Claims, 7 Drawing Sheets

METHOD FOR FABRICATING SEMICONDUCTOR DEVICE

BACKGROUND OF THE INVENTION (a) Fields of the Invention

The present invention relates to methods for fabricating a semiconductor device using group III nitride, such as a field effect transistor, a bipolar transistor, or a light emitting element. In particular, the present invention relates to techniques to split a substrate into separate semiconductor elements.

(b) Description of Related Art

Group III nitride semiconductors made of GaN, AlN, InN, or a mixed crystal composed of these materials (hereinafter, referred simply to as nitride semiconductors) find applications in light emitting elements because they have wide band gap. Besides, they also find utilizations in developments of, for example, high-frequency, high-power electronic devices such as field effect transistors or bipolar transistors because they have high breakdown voltage, high electron saturation velocity and high electron mobility.

In fabricating semiconductor devices using these nitride semiconductors, it is difficult to produce single crystal wafers made of the nitride semiconductors. Thus, a nitride semiconductor crystal layer has been grown on a base substrate made of a material with a lattice constant and a thermal expansion coefficient different from those of the nitride semiconductor grown, such as a sapphire substrate and a SiC substrate. When a nitride semiconductor crystal layer is grown on a sapphire substrate or a SiC substrate, however, residual stress induced by lattice mismatch between the substrate and the nitride semiconductor crystal layer and accompanying residual strain are present and the stress and strain cause a problem such as bowing of the substrate. To overcome this problem, as one approach for removing the residual strain, a technique is developed in which the base substrate is irradiated with light from the back surface side thereof to form, at the interface between the substrate and the nitride semiconductor crystal layer, a thermally decomposed layer made by thermally decomposing the crystal layer (see Japanese Unexamined Patent Publication No. 2003-37286 and U.S. Pat. No. 6,071,795).

The conventional technique in which the base substrate is merely irradiated with light from the back surface side thereof to form a thermally decomposed layer at the interface between the substrate and the nitride semiconductor crystal layer, however, creates the following problems. Since the thermally decomposed layer is mainly composed of group III metal, it has a low melting point and high chemical reactivity. Thus, when a normal semiconductor fabrication step such as the step of heating a wafer or the step of exposing a wafer into a reactive gas atmosphere is conducted after the thermally decomposed layer formation step, the group III metal evaporates from the thermally decomposed layer to cause contamination. Furthermore, chemical reactions resulting from the normal fabrication step alter or deform the thermally decomposed layer itself to impair the uniformity of the layer within the wafer.

Moreover, since the entire back surface of a wafer is irradiated with light in the conventional technique, the thermally decomposed layer described above is created at the entire interface between the nitride semiconductor layer and the base substrate. As a result, the semiconductor layer cannot be kept fixed fully onto the base substrate, so that the semiconductor layer is displaced in a semiconductor device fabrication process. In this case, even though the thermally decomposed layer is fixed again in the course of a subsequent cooling of the substrate, the layer is melted again, for example, in the case where the substrate temperature is elevated above the room temperature in the process of semiconductor element fabrication on the substrate, resulting in displacement of the fabricated semiconductor element from the substrate. This is because the thermally decomposed layer is mainly composed of Ga, Al, In, or the like belonging to group III metal and thus has a low melting point.

SUMMARY OF THE INVENTION

In view of the foregoing, an object of the present invention is to prevent displacement of a semiconductor layer in a semiconductor device fabrication process and contamination, alteration or deformation or the like of the semiconductor layer in a heating step, and simultaneously to uniformly relax residual stress or residual strain within a wafer surface on which the semiconductor layer has been grown.

To accomplish the above object, a semiconductor device fabrication method of the present invention comprises the steps of: forming a thermally decomposed layer by irradiating a semiconductor layer formed on one surface of a substrate with light from the side of the other surface of the substrate to thermally decompose part of a region of the semiconductor layer in contact with the substrate; and removing the thermally decomposed layer with the substrate kept bonded with the semiconductor layer.

In the semiconductor device fabrication method of the present invention, a semiconductor layer formed on one surface (the front surface) of a substrate is irradiated with light from the side of the other surface (the back surface) of the substrate to form a thermally decomposed layer. Therefore, the elasticity of the thermally decomposed layer can relax residual strain within the front surface of the substrate, which avoids problems such as bowing of the substrate. Furthermore, part of the semiconductor layer is thermally decomposed to form the thermally decomposed layer. In other words, only a portion of the back surface of the substrate is irradiated with light to form the thermally decomposed layer. Therefore, no thermally decomposed layer is formed in the portion of the semiconductor layer (properly speaking, the region of the semiconductor layer in contact with the substrate) not irradiated with light. That is to say, the region of the semiconductor layer not formed with the thermally decomposed layer is kept bonded directly with the substrate, so that the semiconductor layer can be kept fixed fully onto the base substrate. This prevents displacement in the position of the semiconductor layer.

In addition, in the semiconductor device fabrication method of the present invention, the thermally decomposed layer itself is removed. Therefore, even though, after the removal, the substrate is heated to a temperature more than the melting point of the thermally decomposed layer, contamination, alteration or deformation induced by the heating can be prevented. That is to say, the substrate can be heated to a temperature more than the melting point of the thermally decomposed layer while contamination, alteration or deformation induced by the heating is prevented.

Preferably, in the semiconductor device fabrication method of the present invention, the semiconductor layer is made of group III nitride. This ensures formation of the thermally decomposed layer.

Preferably, in the semiconductor device fabrication method of the present invention, in the step of forming a thermally decomposed layer, the thermally decomposed layer is formed on the one surface of the substrate in a symmetrical shape with respect to the center of the one surface.

This relaxes initial residual strain having occurred in the substrate surface in forming the semiconductor layer uniformly and isotropically over the substrate surface.

In the step of forming a thermally decomposed layer in the semiconductor device fabrication method of the present invention, the thermally decomposed layer may be formed either on only the perimeter of the substrate surface or on the substrate surface other than the center portion.

Preferably, in the semiconductor device fabrication method of the present invention, in the step of forming a thermally decomposed layer, the thermally decomposed layer is formed concentrically, radially, or spirally on the one surface of the substrate.

This relaxes strain present in the substrate surface uniformly and almost symmetrically with respect to the center of the substrate surface.

Preferably, in the semiconductor device fabrication method of the present invention, in the step of forming a thermally decomposed layer, the thermally decomposed layer is formed to have a portion exposed at an edge of the semiconductor layer, and in the step of removing the thermally decomposed layer, the thermally decomposed layer is etched with acidic solution from the exposed portion thereof.

This ensures removal of the entire thermally-decomposed layer by the etching.

The semiconductor device fabrication method of the present invention may further comprise, after the step of removing the thermally decomposed layer, the step of heating the substrate to a temperature more than the melting point of the thermally decomposed layer.

The semiconductor device fabrication method of the present invention may further comprise, after the step of removing the thermally decomposed layer, the step of forming a plurality of semiconductor elements using the semiconductor layer as respective active layers.

Preferably, in the above case, the semiconductor device fabrication method further comprises, after the step of forming a plurality of semiconductor elements, the step of splitting the substrate into the plurality of separate semiconductor elements. Preferably, in the above case, the step of forming a thermally decomposed layer includes the substep of irradiating the semiconductor layer with light along a dicing line of the substrate to form the thermally decomposed layer in linear shape, and the step of splitting the substrate includes the substep of splitting the substrate along a linear region where the thermally decomposed layer has been removed. This fabricates the semiconductor elements with residual strain within the substrate surface relaxed, and yields the semiconductor elements as individual chips.

Preferably, in the above case, the semiconductor device fabrication method further comprises, after the step of forming a plurality of semiconductor elements, the step of splitting the substrate into the plurality of separate semiconductor elements. Preferably, in the above case, the step of forming a thermally decomposed layer includes the substep of irradiating the semiconductor layer with light so that a region of the substrate not irradiated with the light along a dicing line is present in linear shape, and the step of splitting the substrate includes the substep of splitting the substrate along the linear region not irradiated with the light. This fabricates the semiconductor elements with residual strain within the substrate surface relaxed, and separates each of the semiconductor elements from the substrate in such a thin film form that each element can be applied to another substrate.

As described above, with the present invention, in a wafer surface on which crystal growth of a semiconductor layer has been performed, formation of a thermally decomposed layer can uniformly relax residual stress or residual strain, which avoids problems such as bowing of a substrate. Furthermore, the thermally decomposed layer is removed with the semiconductor layer kept bonded with the substrate, which prevents displacement in the position of the semiconductor layer in a subsequent semiconductor device fabrication process and also prevents occurrence of contamination, alteration or deformation of the semiconductor layer in a subsequent heating step. That is to say, a semiconductor device can be fabricated which uses a semiconductor layer capable of eliminating dislocation in the semiconductor device fabrication process and capable of resisting a heating process step while residual stress or residual strain is relaxed and bowing of the substrate or other troubles are prevented.

Accordingly, if the present invention relating to the semiconductor device fabrication method is applied to crystal growth of a semiconductor layer on a wafer, a useful effect can be obtained in which residual stress or residual strain can be uniformly relaxed over the wafer surface on which the semiconductor layer is grown and concurrently in which displacement in the position of the semiconductor layer in a semiconductor device fabrication process and contamination, alteration or deformation of the semiconductor layer in a heating process step are prevented.

DETAILED DESCRIPTION OF THE PREFERRED EMBODIMENTS (First Embodiment)

A method for fabricating a semiconductor device according to a first embodiment of the present invention will be described below with reference to the accompanying drawings.

FIGS. 1A and 1C to 1G are sectional views showing process steps of the semiconductor device fabrication method according to the first embodiment. FIG. 1B is a plan view showing one process step of the semiconductor device fabrication method according to the first embodiment.

Figure 1A:
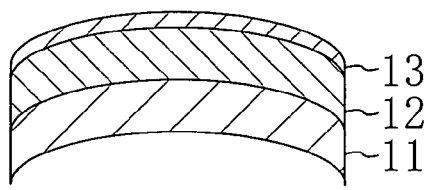
FIGS. 1A and 1C to 1G are sectional views showing process steps of a semiconductor device fabrication method according to a first embodiment of the present invention.
Figure 1B:
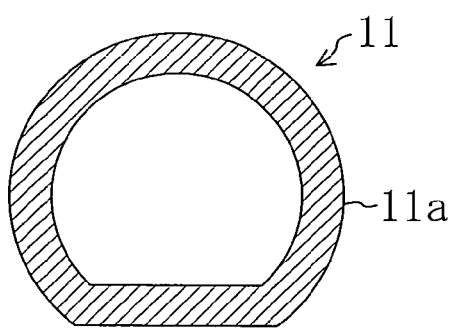
FIG. 1B is a plan view showing one process step of the semiconductor device fabrication method according to the first embodiment of the present invention.

Referring to FIG. 1A, first, for example, the c-plane of a sapphire substrate 11 with a thickness of about 400 μm is defined as a main surface. On the main surface of the sapphire substrate 11, a first semiconductor layer 12 of, for example, gallium nitride (GaN) having a thickness of about 2 to 3 μm is formed by metal organic vapor phase epitaxy (MOVPE) or the like. Then, on the first semiconductor layer 12, a second semiconductor layer 13 is formed which is made of, for example, mixed crystal of a nitride containing aluminum and gallium ($Al_xGa_{1-x}N$ (where 0<x<1)) and has a thickness of about 25 nm. In this state, residual stress induced by lattice mismatch between the sapphire substrate 11 and the first semiconductor layer 12 and accompanying residual strain are present, and the stress and strain bow the sapphire substrate 11 as shown in FIG. 1A.

Figure 1C:
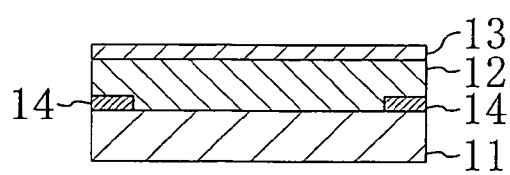

Next, the sapphire substrate 11 with the semiconductor layers 12 and 13 stacked on the main surface thereof is irradiated with a third-order harmonic of Nd:YAG laser or the like from the side of the back surface of the sapphire substrate 11 (the surface thereof opposite to the main surface). An exemplary irradiation condition of the harmonic is as follows: the irradiation energy is 0.3 J/cm$^2$, the interval between pulses is 5 ns, and the diameter of the laser beam is 1.00 μm. Specifically, in the first embodiment, as shown in FIG. 1B, the perimeter of the back surface of the sapphire substrate 11 is defined as a light-irradiated portion 11a. Since the sapphire substrate 11 is transparent with respect to a laser beam, the laser beam applied from the back surface side of the sapphire substrate 11 is absorbed into the vicinity of the interface of the first semiconductor layer (GaN layer) 12 with the sapphire substrate 11. This absorption thermally decomposes only a portion of the GaN layer 12 positioned in the vicinity of the interface. Consequently, as shown in FIG. 1C, a thin thermally decomposed layer 14 mainly composed of Ga is created around a portion of the perimeter of the GaN layer 12 located at the interface with the sapphire substrate 11 and corresponding to the light-irradiated portion 11a. By thus creating the thermally decomposed layer 14, strain present in the perimeter of the sapphire substrate 11 can be relaxed uniformly and almost symmetrically with respect to the center of the substrate surface.

In general, the thermally decomposed layer 14 has a low melting point. Therefore, in the fabrication process of the semiconductor device employing the first semiconductor layer (GaN layer) 12 and the second semiconductor layer (AlGaN layer) 13, if the sapphire substrate 11 with the thermally decomposed layer 14 having been formed is heated, the following problem arises: because of contamination resulting from vaporization, diffusion or other phenomenon of Ga in the thermally decomposed layer 14 or oxidation of Ga therein, the thickness of the thermally decomposed layer 14 is made nonuniform or the surface shape of the AlGaN layer 13 is made uneven, and variation in the performances of the semiconductor devices ultimately fabricated from the substrate results within the substrate.

Figure 1D:
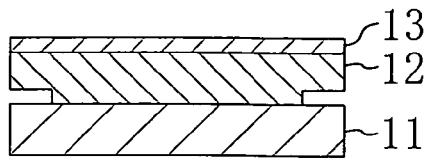

To solve this problem, in the first embodiment, the sapphire substrate 11 with the thermally decomposed layer 14 formed by the laser beam irradiation is immersed in, for example, hydrochloric acid to remove the thermally decomposed layer 14 as shown in FIG. 1D. In this process, as shown in FIG. 1D, the GaN layer 12 is kept bonded with the sapphire substrate 11 at the portion not irradiated with a laser beam (the portion thereof where no thermally decomposed layer 14 is formed).

Figure 1E:
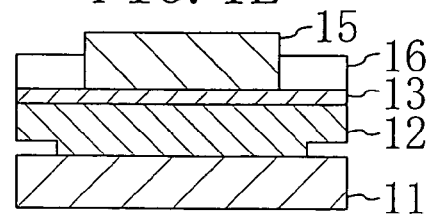

As shown in FIG. 1E, a mask 15 made of, for example, Si is deposited above regions of the GaN layer 12 and the AlGaN layer 13 serving as active regions of the device, after which the substrate 11 is annealed in an oxygen atmosphere at about 900° C. for about nine hours. This annealing selectively oxidizes the region of the AlGaN layer 13 not covered with the mask 15, thereby forming an isolation layer 16. The reason why, during this annealing, the sapphire substrate 11 can be exposed into the oxygen atmosphere for a long time at a high temperature of about 900° C. that is more than the melting point of the thermally decomposed layer 14 is because the thermally decomposed layer 14 has already been removed in the step shown in FIG. 1D.

Figure 1F:
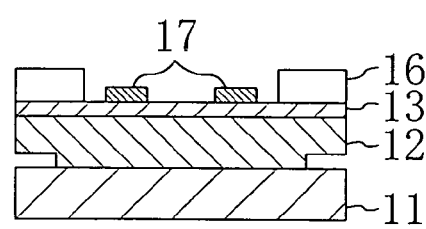

Subsequently, as shown in FIG. 1F, the mask 15 is removed, and then, for example, a pair of source and drain electrodes 17 mainly made by stacking a Ti layer and an Al layer are formed on the exposed portion of the AlGaN layer 13. Thereafter, annealing is performed in, for example, a hydrogen atmosphere at about 600° C. to provide ohmic contact between the AlGaN layer 13 and each of the source and drain electrodes 17. In this annealing, since the thermally decomposed layer 14 has been removed in the step shown in FIG. 1D, adverse effects resulting from vaporization, chemical reaction, or other phenomenon of the thermally decomposed layer 14 can be prevented even though the sapphire substrate 11 is processed at a high temperature of about 600° C. that is more than the melting point of the thermally decomposed layer 14.

Figure 1G:
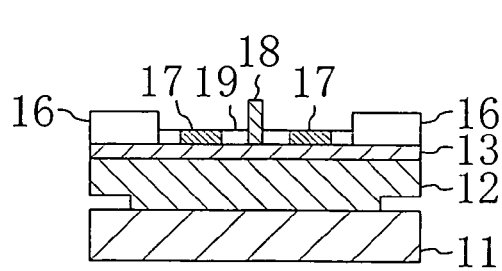

As shown in FIG. 1G, on the region of the AlGaN layer 13 located between the pair of source and drain electrodes 17, a gate electrode 18 is formed by a liftoff method or the like, and then a surface passivation film 19 is formed on the remaining exposed portion of the AlGaN layer 13. Although not shown, subsequent process steps such as interconnect step are conducted to complete the semiconductor device.

As described above, in the first embodiment, the GaN layer 12 formed on the main surface of the sapphire substrate 11 is irradiated with light from the side of the back surface of the sapphire substrate 11 (the surface of the sapphire substrate 11 opposite to the main surface formed with the GaN layer 12) to form the thermally decomposed layer 14. Therefore, the elasticity of the thermally decomposed layer 14 can relax residual strain within the main surface of the substrate, which avoids problems such as bowing of the sapphire substrate 11. Moreover, in the first embodiment, strain in the perimeter of the substrate that generally deforms greatly in the case of causing substrate bowing or the like can be relaxed by controlling the manner of light irradiation (laser beam irradiation).

Furthermore, in the first embodiment, part of the GaN layer 12 is thermally decomposed to form the thermally decomposed layer 14. In other words, only a portion of the back surface of the substrate is irradiated with light to form the thermally decomposed layer 14. Therefore, no thermally decomposed layer 14 is formed in the portion of the GaN layer 12 (properly speaking, the region of the GaN layer 12 in contact with the sapphire substrate 11) not irradiated with light. That is to say, even after the removal of the thermally decomposed layer 14, the region of the GaN layer 12 not formed with the thermally decomposed layer 14 is kept bonded directly with the sapphire substrate 11, so that the GaN layer 12 can be kept fixed fully onto the sapphire substrate 11 as the base substrate. This prevents displacement in the position of the GaN layer 12, and then improves the accuracy of subsequent process steps such as a lithography step.

In addition, in the first embodiment, the thermally decomposed layer 14 itself is removed. Therefore, even though, after the removal, the sapphire substrate 11 is heated to a temperature more than the melting point of the thermally decomposed layer 14, contamination, alteration or deformation induced by the heating can be prevented. That is to say, the sapphire substrate 11 can be heated to a temperature more than the melting point of the thermally decomposed layer 14 while contamination, alteration or deformation induced by the heating is prevented.

In the first embodiment, the type of light applied from the back surface side of the substrate is not limited to a specific light as long as the light can thermally decompose the first semiconductor layer 12.

In the first embodiment, the GaN layer is used as the first semiconductor layer 12. However, the first semiconductor layer 12 is not limited to this, and alternatively a group III nitride layer can be used to ensure formation of the thermally decomposed layer 14. It goes without saying that a semiconductor layer other than the group III nitride layer, such as a GaAs layer or a Si layer, may be used instead.

In the first embodiment, the sapphire substrate 11 is used, but a SiC substrate, a glass substrate, or the like may be used instead.

In the first embodiment, hydrochloric acid is used to remove the thermally decomposed layer 14 by etching, but another acidic solution may be used instead. The thermally decomposed layer 14 may be removed by another technique other than the etching with acidic solution.

(Second Embodiment)

A method for fabricating a semiconductor device according to a second embodiment of the present invention will be described below with reference to the accompanying drawings.

FIGS. 2A and 2C to 2G are sectional views showing process steps of the semiconductor device fabrication method according to the second embodiment. FIG. 2B is a plan view showing one process step of the semiconductor device fabrication method according to the second embodiment.

Figure 2A:
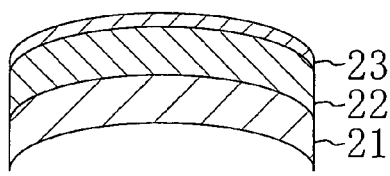
FIGS. 2A and 2C to 2G are sectional views showing process steps of a semiconductor device fabrication method according to a second embodiment of the present invention.

Referring to FIG. 2A, first, for example, the c-plane of a sapphire substrate 21 with a thickness of about 400 µm is defined as a main surface. On the main surface of the sapphire substrate 21, a first semiconductor layer 22 of, for example, GaN having a thickness of about 2 to 3 µm is formed by MOVPE or the like. Then, on the first semiconductor layer 22, a second semiconductor layer 23 is formed which is made of, for example, mixed crystal of a nitride containing aluminum and gallium ($Al_xGa_{1-x}N$ (where $0<x<1$)) and has a thickness of about 25 nm. In this state, residual stress induced by lattice mismatch between the sapphire substrate 21 and the first semiconductor layer 22 and accompanying residual strain are present, and the stress and strain bow the sapphire substrate 21 as shown in FIG. 2A.

Next, the sapphire substrate 21 with the semiconductor layers 22 and 23 stacked on the main surface thereof is irradiated with a third-order harmonic of Nd:YAG laser or the like from the side of the back surface of the sapphire substrate 21 (the surface thereof opposite to the main surface). An exemplary irradiation condition of the harmonic is as follows: the irradiation energy is 0.3 J/cm$^2$, the interval between pulses is 5 ns, and the diameter of the laser beam is 1.00 µm. Specifically, in the second embodiment, as shown in FIG. 2B, almost the entire back surface of the sapphire substrate 21 other than the center and its vicinity is defined as a light-irradiated portion 21a. Since the sapphire substrate 21 is transparent with respect to a laser beam, the laser beam applied from the back surface side of the sapphire substrate 21 is absorbed into the vicinity of the interface of the first semiconductor layer (GaN layer) 22 with the sapphire substrate 21. This absorption thermally decomposes only a portion of the GaN layer 22 positioned in the vicinity of the interface. Consequently, as shown in FIG. 2C, a thin thermally decomposed layer 24 mainly composed of Ga is created around the almost entire interface of the GaN layer 22 (other than the center and its vicinity) with the sapphire substrate 21 corresponding to the light-irradiated portion 21a. By thus creating the thermally decomposed layer 24, residual stress of the sapphire substrate 21 having been present before the beam irradiation can be relaxed, uniformly and almost symmetrically with respect to the center of the substrate, over a wide region of the substrate other than the center and its vicinity.

In general, the thermally decomposed layer 24 has a low melting point. Therefore, in the fabrication process of the semiconductor device employing the first semiconductor layer (GaN layer) 22 and the second semiconductor layer (AlGaN layer) 23, if the sapphire substrate 21 with the thermally decomposed layer 24 having been formed is heated, the following problem arises: because of contamination resulting from vaporization, diffusion or other phenomenon of Ga in the thermally decomposed layer 24 or oxidation of Ga therein, the thickness of the thermally decomposed layer 24 is made nonuniform or the surface shape of the AlGaN layer 23 is made uneven, and variation in the performances of the semiconductor devices ultimately fabricated from the substrate results within the substrate.

Figure 2E:
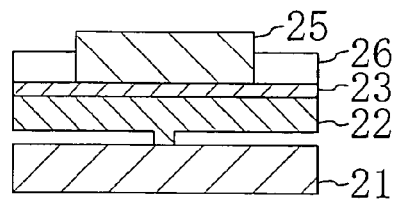
Figure 2B:
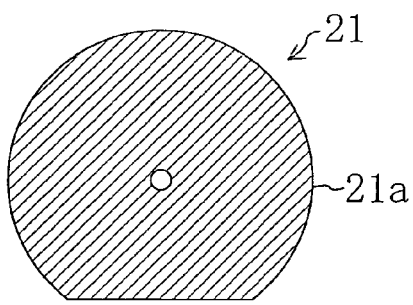
FIG. 2B is a plan view showing one process step of the semiconductor device fabrication method according to the second embodiment of the present invention.
Figure 2F:
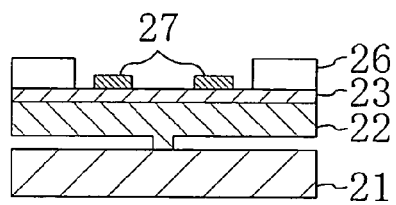
Figure 2C:
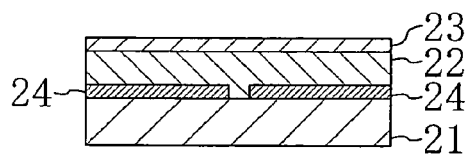
Figure 2G:
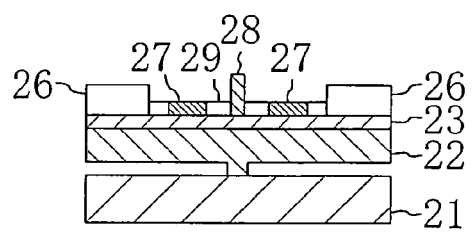
Figure 2D:
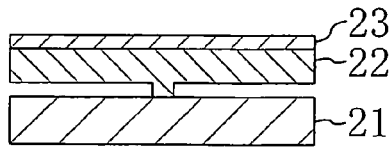

To solve this problem, in the second embodiment, the sapphire substrate 21 with the thermally decomposed layer 24 formed by the laser beam irradiation is immersed in, for example, hydrochloric acid to remove the thermally decomposed layer 24 as shown in FIG. 2D. In this process, as shown in FIG. 2D, the GaN layer 22 is kept bonded with the sapphire substrate 21 at the portion not irradiated with a laser beam (the portion thereof where no thermally decomposed layer 24 is formed), that is, at the center portion.

As shown in FIG. 2E, a mask 25 made of, for example, Si is deposited above regions of the GaN layer 22 and the AlGaN layer 23 serving as active regions of the device, after which the substrate 21 is annealed in an oxygen atmosphere at about 900° C. for about nine hours. This annealing selectively oxidizes the region of the AlGaN layer 23 not covered with the mask 25, thereby forming an isolation layer 26. The reason why, during this annealing, the sapphire substrate 21 can be exposed into the oxygen atmosphere for a long time at a high temperature of about 900° C. that is more than the melting point of the thermally decomposed layer 24 is because the thermally decomposed layer 24 has already been removed in the step shown in FIG. 2D.

Subsequently, as shown in FIG. 2F, the mask 25 is removed, and then, for example, a pair of source and drain electrodes 27 mainly made by stacking a Ti layer and an Al layer are formed on the exposed portion of the AlGaN layer 23. Thereafter, annealing is performed in, for example, a hydrogen atmosphere at about 600° C. to provide ohmic contact between the AlGaN layer 23 and each of the source and drain electrodes 27. In this annealing, since the thermally decomposed layer 24 has been removed in the step shown in FIG. 2D, the sapphire substrate 21 can be processed at a high temperature of about 600° C. that is more than the melting point of the thermally decomposed layer 24 while adverse effects resulting from vaporization, chemical reaction, or other phenomenon of the thermally decomposed layer 24 are prevented.

As shown in FIG. 2G, on the region of the AlGaN layer 23 located between the pair of source and drain electrodes 27, a gate electrode 28 is formed by a liftoff method or the like, and then a surface passivation film 29 is formed on the remaining exposed portion of the AlGaN layer 23. Although not shown, subsequent process steps such as interconnect step are conducted to complete the semiconductor device.

As described above, in the second embodiment, the GaN layer 22 formed on the main surface of the sapphire substrate 21 is irradiated with light from the side of the back surface of the sapphire substrate 21 (the surface of the sapphire substrate 21 opposite to the main surface formed with the GaN layer 22) to form the thermally decomposed layer 24. Therefore, the elasticity of the thermally decomposed layer 24 can relax residual strain within the main surface of the substrate, which avoids problems such as bowing of the sapphire substrate 21. Moreover, in the second embodiment, strain in the entire substrate, other than the substrate center that would deform minimally in the case of causing substrate bowing or the like, can be relaxed by controlling the manner of light irradiation (laser beam irradiation).

Furthermore, in the second embodiment, the entire GaN layer 22 other than the center portion is thermally decomposed to form the thermally decomposed layer 24. In other words, the entire back surface of the substrate other than the center portion is irradiated with light to form the thermally decomposed layer 24. Therefore, no thermally decomposed layer 24 is formed in the center portion of the GaN layer 22 (properly speaking, the region of the GaN layer 22 in contact with the sapphire substrate 21) not irradiated with light. Therefore, even after the removal of the thermally decomposed layer 24, the region of the GaN layer 22 not formed with the thermally decomposed layer 24 is kept bonded directly with the sapphire substrate 21. In other words, even after the removal of the thermally decomposed layer 24, the GaN layer 22 can be supported at the center by the sapphire substrate 21. Therefore, the GaN layer 22 can be kept fixed fully onto the sapphire substrate 21 as the base substrate. This prevents displacement in the position of the GaN layer 22, and then improves the accuracy of subsequent process steps such as a lithography step.

In addition, in the second embodiment, the thermally decomposed layer 24 itself is removed. Therefore, even though, after the removal, the sapphire substrate 21 is heated to a temperature more than the melting point of the thermally decomposed layer 24, contamination, alteration or deformation induced by the heating can be prevented. That is to say, the sapphire substrate 21 can be heated to a temperature more than the melting point of the thermally decomposed layer 24 while contamination, alteration or deformation induced by the heating is prevented.

In the second embodiment, the type of light applied from the back surface side of the substrate is not limited to a specific light as long as the light can thermally decompose the first semiconductor layer 22.

In the second embodiment, the GaN layer is used as the first semiconductor layer 22. However, the first semiconductor layer 22 is not limited to this, and alternatively a group III nitride layer can be used to ensure formation of the thermally decomposed layer 24. It goes without saying that a semiconductor layer other than the group III nitride layer, such as a GaAs layer or a Si layer, may be used instead.

In the second embodiment, the sapphire substrate 21 is used, but a SiC substrate, a glass substrate, or the like may be used instead.

In the second embodiment, hydrochloric acid is used to remove the thermally decomposed layer 24 by etching, but another acidic solution may be used instead. The thermally decomposed layer 24 may be removed by another technique other than the etching with acidic solution.

(Third Embodiment)

A method for fabricating a semiconductor device according to a third embodiment of the present invention will be described below with reference to the accompanying drawings.

Figure 3A:
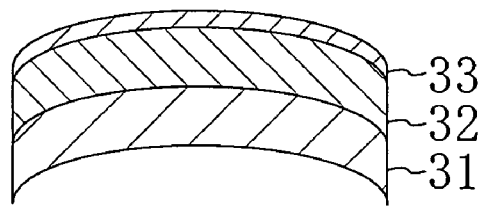
FIGS. 3A, 3C and 3D are sectional views showing process steps of a semiconductor device fabrication method according to a third embodiment of the present invention.
Figure 3B:
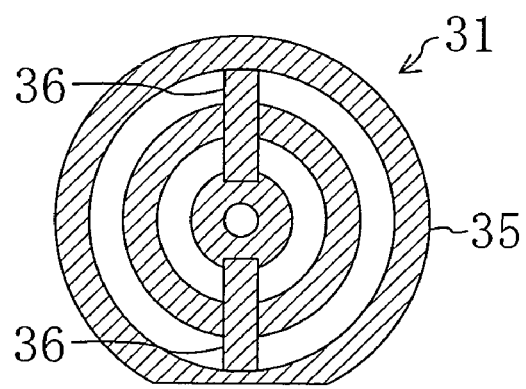
FIG. 3B is a plan view showing one process step of the semiconductor device fabrication method according to the third embodiment of the present invention.
Figure 3C:
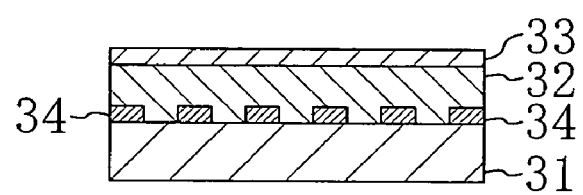
Figure 3D:
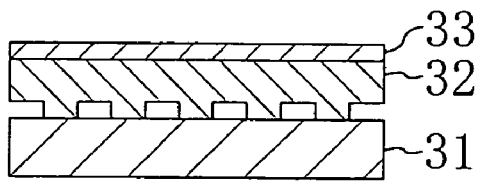

FIGS. 3A, 3C and 3D are sectional views showing process steps of the semiconductor device fabrication method according to the third embodiment. FIG. 3B is a plan view showing one process step of the semiconductor device fabrication method according to the third embodiment.

Referring to FIG. 3A, first, for example, the c-plane of a sapphire substrate 31 with a thickness of about 400 µm is defined as a main surface. On the main surface of the sapphire substrate 31, a first semiconductor layer 32 of, for example, GaN having a thickness of about 2 to 3 µm is formed by MOVPE or the like. Then, on the first semiconductor layer 32, a second semiconductor layer 33 is formed which is made of, for example, mixed crystal of a nitride containing aluminum and gallium ($Al_xGa_{1-x}N$ (where $0<x<1$)) and has a thickness of about 25 nm. In this state, residual stress induced by lattice mismatch between the sapphire substrate 31 and the first semiconductor layer 32 and accompanying residual strain are present, and the stress and strain bow the sapphire substrate 31 as shown in FIG. 3A.

Next, the sapphire substrate 31 with the semiconductor layers 32 and 33 stacked on the main surface thereof is irradiated with a third-order harmonic of Nd:YAG laser or the like from the side of the back surface of the sapphire substrate 31 (the surface thereof opposite to the main surface). An exemplary irradiation condition of the harmonic is as follows: the irradiation energy is 0.3 J/cm², the interval between pulses is 5 ns, and the diameter of the laser beam is 1.00 µm. Specifically, in the third embodiment, as shown in FIG. 3B, light-irradiated portions 35 in concentric configuration are defined in the back surface of the sapphire substrate 31. Since the sapphire substrate 31 is transparent with respect to a laser beam, the laser beam applied from the back surface side of the sapphire substrate 31 is absorbed into the vicinity of the interface of the first semiconductor layer (GaN layer) 32 with the sapphire substrate 31. This absorption thermally decomposes only portions of the GaN layer 32 positioned in the vicinity of the interface. Consequently, as shown in FIG. 3C, thin thermally decomposed layers 34 mainly composed of Ga are created around portions of the GaN layer 32 located at the interface with the sapphire substrate 31 and corresponding to the light-irradiated portions 35 (the concentrically existing portions on the main surface of the substrate). Thus, on the main surface of the sapphire substrate 31, the thermally decomposed layers 34 are created in a symmetrical shape with respect to the substrate center, whereby residual stress of the sapphire substrate 31 having been present before the beam irradiation is relaxed, uniformly and almost symmetrically with respect to the substrate center, over the entire substrate surface.

In general, the thermally decomposed layer 34 has a low melting point. Therefore, in the fabrication process of the semiconductor device employing the first semiconductor layer (GaN layer) 32 and the second semiconductor layer (AlGaN layer) 33, if the sapphire substrate 31 with the thermally decomposed layer 34 having been formed is heated, the following problem arises: because of contamination resulting from vaporization, diffusion or other phenomenon of Ga in the thermally decomposed layer 34 or oxidation of Ga therein, the thickness of the thermally decomposed layer 34 is made nonuniform or the surface shape of the AlGaN layer 33 is made uneven, and variation in the performances of the semiconductor devices ultimately fabricated from the substrate results within the substrate.

To solve this problem, in the third embodiment, the sapphire substrate 31 with the thermally decomposed layers 34 formed by the laser beam irradiation is immersed in, for example, hydrochloric acid to remove the thermally decomposed layers 34 as shown in FIG. 3D. In this process, of the thermally decomposed layers 34 in concentric configuration corresponding to the light-irradiated portions 35 shown in FIG. 3C, the inner ring layers thereof are not supplied with hydrochloric acid simply by immersing the sapphire substrate 31 in hydrochloric acid. This causes problem in which the inner ring layers are not removed by etching. To avoid this problem, in the third embodiment, not only the light-irradiated portions 35 with concentric configuration but also light-irradiated portions 36 for connecting the light-irradiated ring portions 35 to one another are provided on the back surface of the sapphire substrate 31. Therefore, portions of the GaN layer 32 corresponding to the light-irradiated portions 36 are also formed with the thermally decomposed layers 34, so that the thermally decomposed layers 34 are sequentially removed from the layer exposed at the edge of the GaN layer 32 (the outermost ring layer) toward the substrate center. As a result, even the inner ring layers of the thermally decomposed layers 34 are supplied with hydrochloric acid, so that all the thermally decomposed layers 34 are removed by etching with hydrochloric acid.

Also in the third embodiment, as shown in FIG. 3D, the GaN layer 32 after the removal of the thermally decomposed layers 34 is kept bonded with the sapphire substrate 31 at the portions not irradiated with a laser beam (the concentric portions thereof where no thermally decomposed layer 34 is formed).

Thereafter, although not shown, process steps similar to the first or second embodiment shown in FIGS. 1E to 1G or FIGS. 2E to 2G can be conducted to complete the semiconductor device.

As described above, in the third embodiment, the GaN layer 32 formed on the main surface of the sapphire substrate 31 is irradiated with light from the side of the back surface of the sapphire substrate 31 (the surface of the sapphire substrate 31 opposite to the main surface formed with the GaN layer 32) to form the thermally decomposed layers 34. Therefore, the elasticity of the thermally decomposed layer 34 can relax residual strain within the main surface of the substrate, which avoids problems such as bowing of the sapphire substrate 31. That is to say, the manner of light irradiation (laser beam irradiation) described in this embodiment can relax strain caused in the main surface of the substrate and in concentric configuration.

Furthermore, in the third embodiment, parts of the GaN layer 32 are thermally decomposed to form the thermally decomposed layers 34. In other words, the back surface of the substrate is partly irradiated with light to form the thermally decomposed layers 34. Therefore, no thermally decomposed layer 34 is formed in the portion of the GaN layer 32 (properly speaking, the region of the GaN layer 32 in contact with the sapphire substrate 31) not irradiated with light. That is to say, even after the removal of the thermally decomposed layer 34, the region of the GaN layer 32 not formed with the thermally decomposed layer 34 is kept bonded directly with the sapphire substrate 31, so that the GaN layer 32 can be kept fixed fully onto the sapphire substrate 31 as the base substrate. This prevents displacement in the position of the GaN layer 32, and then improves the accuracy of subsequent process steps such as a lithography step.

Moreover, in the third embodiment, the thermally decomposed layers 34 themselves are removed. Therefore, even though, after the removal, the sapphire substrate 31 is heated to a temperature more than the melting point of the thermally decomposed layer 34, contamination, alteration or deformation induced by the heating can be prevented. That is to say, the sapphire substrate 31 can be heated to a temperature more than the melting point of the thermally decomposed layer 34 while contamination, alteration or deformation induced by the heating is prevented.

In the third embodiment, the type of light applied from the back surface side of the substrate is not limited to a specific light as long as the light can thermally decompose the first semiconductor layer 32.

In the third embodiment, the GaN layer is used as the first semiconductor layer 32. However, the first semiconductor layer 32 is not limited to this, and alternatively a group III nitride layer can be used to ensure formation of the thermally decomposed layer 34. It goes without saying that a semiconductor layer other than the group III nitride layer, such as a GaAs layer or a Si layer, may be used instead.

In the third embodiment, the sapphire substrate 31 is used, but a SiC substrate, a glass substrate, or the like may be used instead.

In the third embodiment, hydrochloric acid is used to remove the thermally decomposed layer 34 by etching, but another acidic solution may be used instead. The thermally decomposed layer 34 may be removed by another technique other than the etching with acidic solution.

(Fourth Embodiment)

A method for fabricating a semiconductor device according to a fourth embodiment of the present invention will be described below with reference to the accompanying drawings.

Figure 4A:
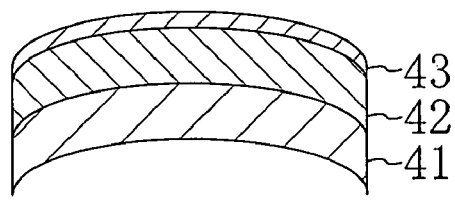
FIGS. 4A, 4C and 4D are sectional views showing process steps of a semiconductor device fabrication method according to a fourth embodiment of the present invention.
Figure 4B:
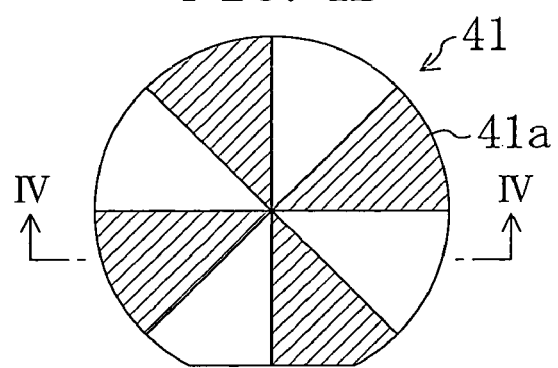
FIG. 4B is a plan view showing one process step of the semiconductor device fabrication method according to the fourth embodiment of the present invention.
Figure 4C:
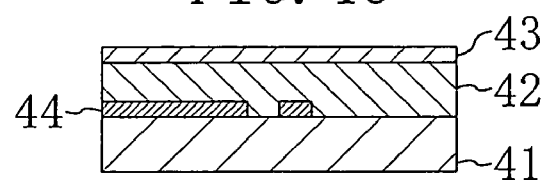
Figure 4D:
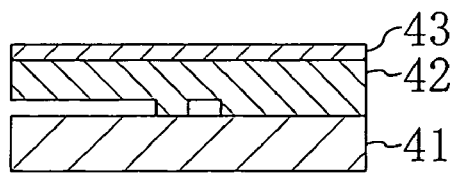

FIGS. 4A, 4C and 4D are sectional views showing process steps of the semiconductor device fabrication method according to the fourth embodiment. FIG. 4B is a plan view showing one process step of the semiconductor device fabrication method according to the fourth embodiment.

Referring to FIG. 4A, first, for example, the c-plane of a sapphire substrate 41 with a thickness of about 400 μm is defined as a main surface. On the main surface of the sapphire substrate 41, a first semiconductor layer 42 of, for example, GaN having a thickness of about 2 to 3 μm is formed by MOVPE or the like. Then, on the first semiconductor layer 42, a second semiconductor layer 43 is formed which is made of, for example, mixed crystal of a nitride containing aluminum and gallium ($Al_xGa_{1-x}N$ (where 0<x<1)) and has a thickness of about 25 nm. In this state, residual stress induced by lattice mismatch between the sapphire substrate 41 and the first semiconductor layer 42 and accompanying residual strain are present, and the stress and strain bow the sapphire substrate 41 as shown in FIG. 4A.

Next, the sapphire substrate 41 with the semiconductor layers 42 and 43 stacked on the main surface thereof is irradiated with a third-order harmonic of Nd:YAG laser or the like from the side of the back surface of the sapphire substrate 41 (the surface thereof opposite to the main surface). An exemplary irradiation condition of the harmonic is as follows: the irradiation energy is 0.3 J/cm², the interval between pulses is 5 ns, and the diameter of the laser beam is 1.00 μm. Specifically, in the fourth embodiment, as shown in FIG. 4B, light-irradiated portions 41a in radial configuration are defined in the back surface of the sapphire substrate 41. Since the sapphire substrate 41 is transparent with respect to a laser beam, the laser beam applied from the back surface side of the sapphire substrate 41 is absorbed into the vicinity of the interface of the first semiconductor layer (GaN layer) 42 with the sapphire substrate 41. This absorption thermally decomposes only portions of the GaN layer 42 positioned in the vicinity of the interface. Consequently, as shown in FIG. 4C, thin thermally decomposed layers 44 mainly composed of Ga are created around portions of the GaN layer 42 located at the interface with the sapphire substrate 41 and corresponding to the light-irradiated portions 41a (the radially existing portions on the main surface of the substrate). Thus, on the main surface of the sapphire substrate 41, the thermally decomposed layers 44 are created in a symmetrical shape with respect to the substrate center, whereby residual stress of the sapphire substrate 41 having been present before the beam irradiation is relaxed, uniformly and almost symmetrically with respect to the substrate center, over the entire substrate surface. Note that FIG. 4C is a sectional view taken along the line IV—IV of FIG. 4B.

In general, the thermally decomposed layer 44 has a low melting point. Therefore, in the fabrication process of the semiconductor device employing the first semiconductor layer (GaN layer) 42 and the second semiconductor layer (AlGaN layer) 43, if the sapphire substrate 41 with the thermally decomposed layers 44 having been formed is heated, the following problem arises: because of contamination resulting from vaporization, diffusion or other phenomenon of Ga in the thermally decomposed layer 44 or oxidation of Ga therein, the thickness of the thermally decomposed layer 44 is made nonuniform or the surface shape of the AlGaN layer 43 is made uneven, and variation in the performances of the semiconductor devices ultimately fabricated from the substrate results within the substrate.

To solve this problem, in the fourth embodiment, the sapphire substrate 41 with the thermally decomposed layers 44 formed by the laser beam irradiation is immersed in, for example, hydrochloric acid to remove the thermally decomposed layers 44 as shown in FIG. 4D. In this process, each of the thermally decomposed layers 44 is gradually removed from the portion thereof exposed at the edge of the GaN layer 42 toward the substrate center. As a result, even the portion of the thermally decomposed layer 44 formed around the substrate center is supplied with hydrochloric acid, so that the entire thermally-decomposed layer 44 is removed by etching with hydrochloric acid.

Also in the fourth embodiment, as shown in FIG. 4D, the GaN layer 42 after the removal of the thermally decomposed layers 44 is kept bonded with the sapphire substrate 41 at the portions not irradiated with a laser beam (the radial portions thereof where no thermally decomposed layer 44 is formed).

Thereafter, although not shown, process steps similar to the first or second embodiment shown in FIGS. 1E to 1G or FIGS. 2E to 2G can be conducted to complete the semiconductor device.

As described above, in the fourth embodiment, the GaN layer 42 formed on the main surface of the sapphire substrate 41 is irradiated with light from the side of the back surface of the sapphire substrate 41 (the surface of the sapphire substrate 41 opposite to the main surface formed with the GaN layer 42) to form the thermally decomposed layers 44. Therefore, the elasticity of the thermally decomposed layer 44 can relax residual strain within the main surface of the substrate, which avoids problems such as bowing of the sapphire substrate 41. That is to say, the manner of light irradiation (laser beam irradiation) described in this embodiment can relax strain present in the main surface of the substrate uniformly and symmetrically with respect to the substrate center.

Furthermore, in the fourth embodiment, parts of the GaN layer 42 are thermally decomposed to form the thermally decomposed layers 44. In other words, the back surface of the substrate is partly irradiated with light to form the thermally decomposed layers 44. Therefore, no thermally decomposed layer 44 is formed in the portion of the GaN layer 42 (properly speaking, the region of the GaN layer 42 in contact with the sapphire substrate 41) not irradiated with light. That is to say, even after the removal of the thermally decomposed layer 44, the region of the GaN layer 42 not formed with the thermally decomposed layer 44 is kept bonded directly with the sapphire substrate 41, so that the GaN layer 42 can be kept fixed fully onto the sapphire substrate 41 as the base substrate. This prevents displacement in the position of the GaN layer 42, and then improves the accuracy of subsequent process steps such as a lithography step.

Moreover, in the fourth embodiment, the thermally decomposed layers 44 themselves are removed. Therefore, even though, after the removal, the sapphire substrate 41 is heated to a temperature more than the melting point of the thermally decomposed layer 44, contamination, alteration or deformation induced by the heating can be prevented. That is to say, the sapphire substrate 41 can be heated to a temperature more than the melting point of the thermally decomposed layer 44 while contamination, alteration or deformation induced by the heating is prevented.

In the fourth embodiment, the type of light applied from the back surface side of the substrate is not limited to a specific light as long as the light can thermally decompose the first semiconductor layer 42.

In the fourth embodiment, the GaN layer is used as the first semiconductor layer 42. However, the first semiconductor layer 42 is not limited to this, and alternatively a group III nitride layer can be used to ensure formation of the thermally decomposed layer 44. It goes without saying that a semiconductor layer other than the group III nitride layer, such as a GaAs layer or a Si layer, may be used instead.

In the fourth embodiment, the sapphire substrate 41 is used, but a SiC substrate, a glass substrate, or the like may be used instead.

In the fourth embodiment, hydrochloric acid is used to remove the thermally decomposed layer 44 by etching, but another acidic solution may be used instead. The thermally decomposed layer 44 may be removed by another technique other than the etching with acidic solution.

(Fifth Embodiment)

A method for fabricating a semiconductor device according to a fifth embodiment of the present invention will be described below with reference to the accompanying drawings.

Figure 5A:
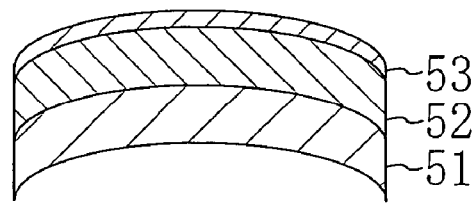
FIGS. 5A, 5C and 5D are sectional views showing process steps of a semiconductor device fabrication method according to a fifth embodiment of the present invention.
Figure 5B:
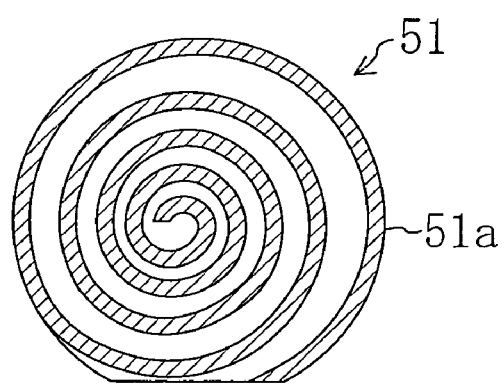
FIG. 5B is a plan view showing one process step of the semiconductor device fabrication method according to the fifth embodiment of the present invention.
Figure 5C:
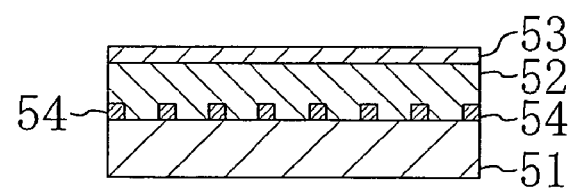
Figure 5D:
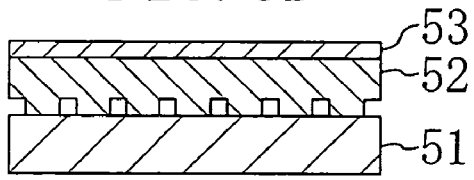

FIGS. 5A, 5C and 5D are sectional views showing process steps of the semiconductor device fabrication method according to the fifth embodiment. FIG. 5B is a plan view showing one process step of the semiconductor device fabrication method according to the fifth embodiment.

Referring to FIG. 5A, first, for example, the c-plane of a sapphire substrate 51 with a thickness of about 400 µm is defined as a main surface. On the main surface of the sapphire substrate 51, a first semiconductor layer 52 of, for example, GaN having a thickness of about 2 to 3 µm is formed by MOVPE or the like. Then, on the first semiconductor layer 52, a second semiconductor layer 53 is formed which is made of, for example, mixed crystal of a nitride containing aluminum and gallium ($Al_xGa_{1-x}N$ (where $0<x<1$)) and has a thickness of about 25 nm. In this state, residual stress induced by lattice mismatch between the sapphire substrate 51 and the first semiconductor layer 52 and accompanying residual strain are present, and the stress and strain bow the sapphire substrate 51 as shown in FIG. 5A.

Next, the sapphire substrate 51 with the semiconductor layers 52 and 53 stacked on the main surface thereof is irradiated with a third-order harmonic of Nd:YAG laser or the like from the side of the back surface of the sapphire substrate 51 (the surface thereof opposite to the main surface). An exemplary irradiation condition of the harmonic is as follows: the irradiation energy is 0.3 $J/cm^2$, the interval between pulses is 5 ns, and the diameter of the laser beam is 1.00 µm. Specifically, in the fifth embodiment, as shown in FIG. 5B, a light-irradiated portion 51a in spiral configuration is defined in the back surface of the sapphire substrate 51. Since the sapphire substrate 51 is transparent with respect to a laser beam, the laser beam applied from the back surface side of the sapphire substrate 51 is absorbed into the vicinity of the interface of the first semiconductor layer (GaN layer) 52 with the sapphire substrate 51. This absorption thermally decomposes only a portion of the GaN layer 52 positioned in the vicinity of the interface. Consequently, as shown in FIG. 5C, a thin thermally decomposed layer 54 mainly composed of Ga is created around a portion of the GaN layer 52 located at the interface with the sapphire substrate 51 and corresponding to the light-irradiated portion 51a (a spirally existing portion thereof on the main surface of the substrate). Thus, on the main surface of the sapphire substrate 51, the thermally decomposed layer 54 is created in a symmetrical shape with respect to the substrate center, whereby residual stress of the sapphire substrate 51 having been present before the beam irradiation is relaxed uniformly over the entire substrate surface.

In general, the thermally decomposed layer 54 has a low melting point. Therefore, in the fabrication process of the semiconductor device employing the first semiconductor layer (GaN layer) 52 and the second semiconductor layer (AlGaN layer) 53, if the sapphire substrate 51 with the thermally decomposed layers 54 having been formed is heated, the following problem arises: because of contamination resulting from vaporization, diffusion or other phenomenon of Ga in the thermally decomposed layer 54 or oxidation of Ga therein, the thickness of the thermally decomposed layer 54 is made nonuniform or the surface shape of the AlGaN layer 53 is made uneven, and variation in the performances of the semiconductor devices ultimately fabricated from the substrate results within the substrate.

To solve this problem, in the fifth embodiment, the sapphire substrate 51 with the thermally decomposed layer 54 formed by the laser beam irradiation is immersed in, for example, hydrochloric acid to remove the thermally decomposed layer 54 as shown in FIG. 5D. In this process, the thermally decomposed layer 54 is gradually removed from the portion thereof exposed at the edge of the GaN layer 52 toward the substrate center. As a result, even the portion of the thermally decomposed layer 54 formed around the substrate center is supplied with hydrochloric acid, so that the entire thermally decomposed layer 54 is removed by etching with hydrochloric acid.

Also in the fifth embodiment, as shown in FIG. 5D, the GaN layer 52 after the removal of the thermally decomposed layer 54 is kept bonded with the sapphire substrate 51 at the portion not irradiated with a laser beam (the spiral portion thereof where no thermally decomposed layer 54 is formed).

Thereafter, although not shown, process steps similar to the first or second embodiment shown in FIGS. 1E to 1G or FIGS. 2E to 2G can be conducted to complete the semiconductor device.

As described above, in the fifth embodiment, the GaN layer 52 formed on the main surface of the sapphire substrate 51 is irradiated with light from the side of the back surface of the sapphire substrate 51 (the surface of the sapphire substrate 51 opposite to the main surface formed with the GaN layer 52) to form the thermally decomposed layer 54. Therefore, the elasticity of the thermally decomposed layer 54 can relax residual strain within the main surface of the substrate, which avoids problems such as bowing of the sapphire substrate 51. That is to say, the manner of light irradiation (laser beam irradiation) described in this embodiment can relax residual stress present in the main surface of the substrate almost uniformly and almost symmetrically with respect to the substrate center.

Furthermore, in the fifth embodiment, part of the GaN layer 52 is thermally decomposed to form the thermally decomposed layer 54. In other words, the back surface of the substrate is partly irradiated with light to form the thermally decomposed layer 54. Therefore, no thermally decomposed layer 54 is formed in the portion of the GaN layer 52 (properly speaking, the region of the GaN layer 52 in contact with the sapphire substrate 51) not irradiated with light. That is to say, even after the removal of the thermally decomposed layer 54, the region of the GaN layer 52 not formed with the thermally decomposed layer 54 is kept bonded directly with the sapphire substrate 51, so that the GaN layer 52 can be kept fixed fully onto the sapphire substrate 51 as the base substrate. This prevents displacement in the position of the GaN layer 52, and then improves the accuracy of subsequent process steps such as a lithography step.

Moreover, in the fifth embodiment, the thermally decomposed layer 54 itself is removed. Therefore, even though, after the removal, the sapphire substrate 51 is heated to a temperature more than the melting point of the thermally decomposed layer 54, contamination, alteration or deformation induced by the heating can be prevented. That is to say, the sapphire substrate 51 can be heated to a temperature more than the melting point of the thermally decomposed layer 54 while contamination, alteration or deformation induced by the heating is prevented.

In the fifth embodiment, the type of light applied from the back surface side of the substrate is not limited to a specific light as long as the light can thermally decompose the first semiconductor layer 52.

In the fifth embodiment, the GaN layer is used as the first semiconductor layer 52. However, the first semiconductor layer 52 is not limited to this, and alternatively a group III nitride layer can be used to ensure formation of the thermally decomposed layer 54. It goes without saying that a semiconductor layer other than the group III nitride layer, such as a GaAs layer or a Si layer, may be used instead.

In the fifth embodiment, the sapphire substrate 51 is used, but a SiC substrate, a glass substrate, or the like may be used instead.

In the fifth embodiment, hydrochloric acid is used to remove the thermally decomposed layer 54 by etching, but another acidic solution may be used instead. The thermally decomposed layer 54 may be removed by another technique other than the etching with acidic solution.

(Sixth Embodiment)

A method for fabricating a semiconductor device according to a sixth embodiment of the present invention will be described below with reference to the accompanying drawings.

FIGS. 6A and 6C to 6E are sectional views showing process steps of the semiconductor device fabrication method according to the sixth embodiment. FIG. 6B is a plan view showing one process step of the semiconductor device fabrication method according to the sixth embodiment.

Figure 6A:
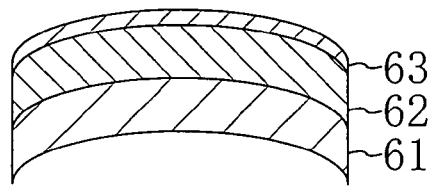
FIGS. 6A and 6C to 6E are sectional views showing process steps of a semiconductor device fabrication method according to a sixth embodiment of the present invention.
Figure 6B:
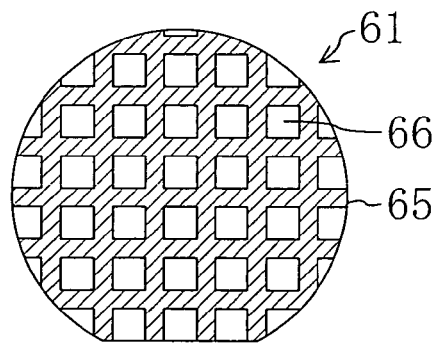
FIG. 6B is a plan view showing one process step of the semiconductor device fabrication method according to the sixth embodiment of the present invention.

Referring to FIG. 6A, first, for example, the c-plane of a sapphire substrate 61 with a thickness of about 400 μm is defined as a main surface. On the main surface of the sapphire substrate 61, a first semiconductor layer 62 of, for example, GaN having a thickness of about 2 to 3 μm is formed by MOVPE or the like. Then, on the first semiconductor layer 62, a second semiconductor layer 63 is formed which is made of, for example, mixed crystal of a nitride containing aluminum and gallium ($Al_xGa_{1-x}N$ (where 0<x<1)) and has a thickness of about 25 nm. In this state, residual stress induced by lattice mismatch between the sapphire substrate 61 and the first semiconductor layer 62 and accompanying residual strain are present, and the stress and strain bow the sapphire substrate 61 as shown in FIG. 6A.

Figure 6C:
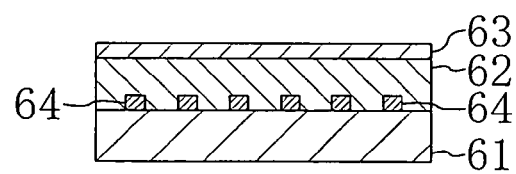

Next, the sapphire substrate 61 with the semiconductor layers 62 and 63 stacked on the main surface thereof is irradiated with a third-order harmonic of Nd:YAG laser or the like from the side of the back surface of the sapphire substrate 61 (the surface thereof opposite to the main surface). An exemplary irradiation condition of the harmonic is as follows: the irradiation energy is 0.3 J/cm$^2$, the interval between pulses is 5 ns, and the diameter of the laser beam is 1.00 μm. Specifically, in the sixth embodiment, as shown in FIG. 6B, a light-irradiated portion 65 having a pattern of traces along dicing lines (see the alternate long and short dash lines in FIG. 6D) for splitting the sapphire substrate 61 into chips is defined in the back surface of the sapphire substrate 61. In other words, in the sixth embodiment, regions partitioned by the light-irradiated portion 65 (that is, light-unirradiated portions) serve as chip formation regions 66. Since the sapphire substrate 61 is transparent with respect to a laser beam, the laser beam applied from the back surface side of the sapphire substrate 61 is absorbed into the vicinity of the interface of the first semiconductor layer (GaN layer) 62 with the sapphire substrate 61. This absorption thermally decomposes only a portion of the GaN layer 62 positioned in the vicinity of the interface. Consequently, as shown in FIG. 6C, a thin thermally decomposed layer 64 mainly composed of Ga is created around a portion of the GaN layer 62 at the interface with the sapphire substrate 61 and corresponding to the light-irradiated portion 65 (the portion existing along the dicing line on the main surface of the substrate). That is to say, the linear thermally-decomposed layer 64 is created along the dicing line of the sapphire substrate 61. Since the thermally decomposed layer 64 in this embodiment is formed over the entire wafer so that the dimension of the thermally decomposed layer 64 is sufficiently smaller than that of the entire substrate (wafer), residual stress within the wafer surface having been present before the beam irradiation is relaxed uniformly over the wafer surface.

In general, the thermally decomposed layer 64 has a low melting point. Therefore, in the fabrication process of the semiconductor device employing the first semiconductor layer (GaN layer) 62 and the second semiconductor layer (AlGaN layer) 63, if the sapphire substrate 61 with the thermally decomposed layer 64 having been formed is heated, the following problem arises: because of contamination resulting from vaporization, diffusion or other phenomenon of Ga in the thermally decomposed layer 64 or oxidation of Ga therein, the thickness of the thermally decomposed layer 64 is made nonuniform or the surface shape of the AlGaN layer 63 is made uneven, and variation in the performances of the semiconductor devices ultimately fabricated from the substrate results within the substrate.

Figure 6D:
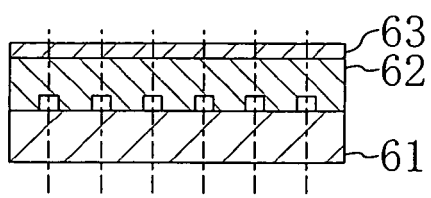

To solve this problem, in the sixth embodiment, the sapphire substrate 61 with the thermally decomposed layer 64 formed by the laser beam irradiation is immersed in, for example, hydrochloric acid to remove the thermally decomposed layer 64 as shown in FIG. 6D. In this process, the thermally decomposed layer 64 is gradually removed from the portion thereof exposed at the edge of the GaN layer 62 toward the substrate center. As a result, hydrochloric acid is supplied even to the portion of the thermally decomposed layer 64 formed around the substrate center, so that the entire thermally-decomposed layer 64 is removed by etching with hydrochloric acid.

Also in the sixth embodiment, as shown in FIG. 6D, the GaN layer 62 after the removal of the thermally decomposed layer 64 is kept bonded with the sapphire substrate 61 at the portion not irradiated with a laser beam (the portion thereof where no thermally decomposed layer 64 is formed).

Thereafter, although not shown, process steps similar to the first or second embodiment shown in FIGS. 1E to 1G or FIGS. 2E to 2G can be conducted to fabricate, in each of the chip formation regions 66 (see FIG. 6B), a semiconductor element using the GaN layer 62 and the AlGaN layer 63 as active layers.

Figure 6E:
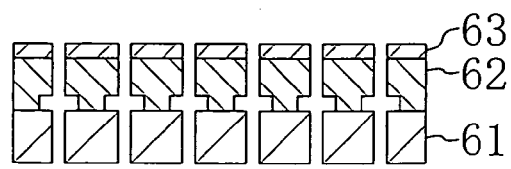

After the semiconductor devices shown in FIG. 6D are fabricated, as shown in FIG. 6E, the sapphire substrate 61 is diced along the dicing lines of the sapphire substrate 61. In other words, the sapphire substrate 61 is split along the linearly-formed regions where the thermally decomposed layer 64 has been removed. During this dicing, the AlGaN layer 63 and a portion of the GaN layer 62 located on the region where the thermally decomposed layer 64 has been removed (referred hereinafter to as an upper GaN layer 62) are so thin that they can be cut off easily. In addition, the sapphire substrate 61 can be cut off into individual semiconductor elements while no damage is caused to the GaN layer 62 and the AlGaN layer 63 in the chip formation region 66.

As described above, in the sixth embodiment, the GaN layer 62 formed on the main surface of the sapphire substrate 61 is irradiated with light from the side of the back surface of the sapphire substrate 61 (the surface of the sapphire substrate 61 opposite to the main surface formed with the GaN layer 62) to form the thermally decomposed layer 64. Therefore, the elasticity of the thermally decomposed layer 64 can relax residual strain within the main surface of the substrate, which avoids problems such as bowing of the sapphire substrate 61.

Furthermore, in the sixth embodiment, part of the GaN layer 62 is thermally decomposed to form the thermally decomposed layer 64. In other words, the back surface of the substrate is partly irradiated with light to form the thermally decomposed layer 64. Therefore, no thermally decomposed layer 64 is formed in the portion of the GaN layer 62 (properly speaking, the region of the GaN layer 62 in contact with the sapphire substrate 61) not irradiated with light. That is to say, even after the removal of the thermally decomposed layer 64, the region of the GaN layer 62 not formed with the thermally decomposed layer 64 is kept bonded directly with the sapphire substrate 61, so that the GaN layer 62 can be kept fixed fully onto the sapphire substrate 61 as the base substrate. This prevents displacement in the position of the GaN layer 62, and then improves the accuracy of subsequent semiconductor element fabrication steps such as a lithography step.

Moreover, in the sixth embodiment, the thermally decomposed layer 64 itself is removed. Therefore, even though, after the removal, the sapphire substrate 61 is heated to a temperature more than the melting point of the thermally decomposed layer 64, contamination, alteration or deformation induced by the heating can be prevented. That is to say, the sapphire substrate 61 can be heated to a temperature more than the melting point of the thermally decomposed layer 64 while contamination, alteration or deformation induced by the heating is prevented.

Moreover, in the sixth embodiment, the GaN layer 62 is irradiated with light along the dicing line of the sapphire substrate 61 to form the thermally decomposed layer 64 in linear shape. Then, the thermally decomposed layer 64 is removed, and the sapphire substrate 61 is split along the dicing line, that is, along the linear region where the thermally decomposed layer 64 has been removed. This individually separates multiple semiconductor elements formed on the sapphire substrate 61. That is to say, in the sixth embodiment, the thermally decomposed layer 64 can be used to relax residual strain within the surface of the sapphire substrate 61 and concurrently to form semiconductor elements. Moreover, the sapphire substrate 61 can be diced using, as a dicing line, the linear region where the thermally decomposed layer 64 has been removed to yield the semiconductor elements as individual chips while no damage is caused to the chip formation regions 66 in which the semiconductor elements have been fabricated.

In the sixth embodiment, the type of light applied from the back surface side of the substrate is not limited to a specific light as long as the light can thermally decompose the first semiconductor layer 62.

In the sixth embodiment, the GaN layer is used as the first semiconductor layer 62. However, the first semiconductor layer 62 is not limited to this, and alternatively a group III nitride layer can be used to ensure formation of the thermally decomposed layer 64. It goes without saying that a semiconductor layer other than the group III nitride layer, such as a GaAs layer or a Si layer, may be used instead.

In the sixth embodiment, the sapphire substrate 61 is used, but a SiC substrate, a glass substrate, or the like may be used instead.

In the sixth embodiment, hydrochloric acid is used to remove the thermally decomposed layer 64 by etching, but another acidic solution may be used instead. The thermally decomposed layer 64 may be removed by another technique other than the etching with acidic solution.

In the sixth embodiment, the thickness of the sapphire substrate 61 may be reduced to about 70 μm before the sapphire substrate 61 is diced.

(Seventh Embodiment)

A method for fabricating a semiconductor device according to a seventh embodiment of the present invention will be described below with reference to the accompanying drawings.

FIGS. 7A and 7C to 7E are sectional views showing process steps of the semiconductor device fabrication method according to the seventh embodiment. FIG. 7B is a plan view showing one process step of the semiconductor device fabrication method according to the seventh embodiment.

Figure 7A:
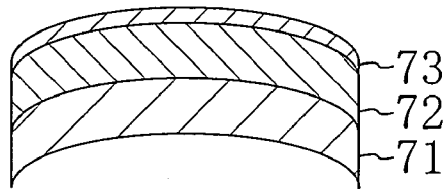
FIGS. 7A and 7C to 7E are sectional views showing process steps of a semiconductor device fabrication method according to a seventh embodiment of the present invention.
Figure 7B:
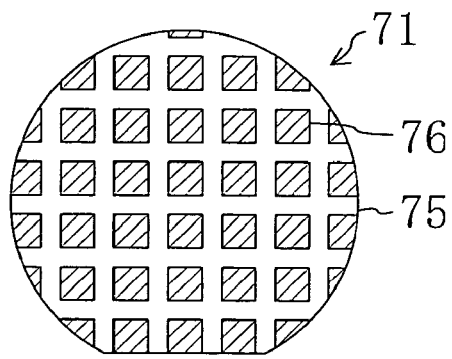
FIG. 7B is a plan view showing one process step of the semiconductor device fabrication method according to the seventh embodiment of the present invention.

Referring to FIG. 7A, first, for example, the c-plane of a sapphire substrate 71 with a thickness of about 400 μm is defined as a main surface. On the main surface of the sapphire substrate 71, a first semiconductor layer 72 of, for example, GaN having a thickness of about 2 to 3 μm is formed by MOVPE or the like. Then, on the first semiconductor layer 72, a second semiconductor layer 73 is formed which is made of, for example, mixed crystal of a nitride containing aluminum and gallium ($Al_xGa_{1-x}N$ (where 0<x<1)) and has a thickness of about 25 nm. In this state, residual stress induced by lattice mismatch between the sapphire substrate 71 and the first semiconductor layer 72 and accompanying residual strain are present, and the stress and strain bow the sapphire substrate 71 as shown in FIG. 7A.

Figure 7C:
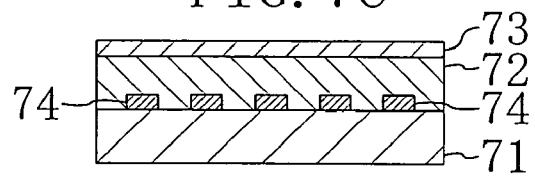

Next, the sapphire substrate 71 with the semiconductor layers 72 and 73 stacked on the main surface thereof is irradiated with a third-order harmonic of Nd:YAG laser or the like from the side of the back surface of the sapphire substrate 71 (the surface thereof opposite to the main surface). An exemplary irradiation condition of the harmonic is as follows: the irradiation energy is 0.3 J/cm$^2$, the interval between pulses is 5 ns, and the diameter of the laser beam is 1.00 μm. Specifically, in the seventh embodiment, as shown in FIG. 7B, light-irradiated portions 76 of configuration corresponding to chip formation regions are defined in the back surface of the sapphire substrate 71. In other words, in the seventh embodiment, a region 75 partitioning the light-irradiated portion 76 (that is, a light-unirradiated portion) is present along dicing lines (see the alternate long and short dash lines in FIG. 7D) for splitting the sapphire substrate 71 into chips. Since the sapphire substrate 71 is transparent with respect to a laser beam, the laser beam applied from the back surface side of the sapphire substrate 71 is absorbed into the vicinity of the interface of the first semiconductor layer (GaN layer) 72 with the sapphire substrate 71. This absorption thermally decomposes only a portion of the GaN layer 72 positioned in the vicinity of the interface. Consequently, as shown in FIG. 7C, thin thermally decomposed layers 74 mainly composed of Ga are created around a portion of the GaN layer 72 located at the interface with the sapphire substrate 71 and corresponding to the light-irradiated portion 76 (the portion existing in the chip formation region on the main surface of the substrate). That is to say, each of the thermally decomposed layers 74 is created to be surrounded by the dicing lines of the sapphire substrate 71. Since the thermally decomposed layers 74 in this embodiment are formed over the entire wafer so that the total dimension of the thermally decomposed layers 74 is sufficiently smaller than that of the entire substrate (wafer), residual stress within the wafer surface having been present before the beam irradiation is relaxed uniformly over the wafer surface.

In general, the thermally decomposed layer 74 has a low melting point. Therefore, in the fabrication process of the semiconductor device employing the first semiconductor layer (GaN layer) 72 and the second semiconductor layer (AlGaN layer) 73, if the sapphire substrate 71 with the thermally decomposed layer 74 having been formed is heated, the following problem arises: because of contamination resulting from vaporization, diffusion or other phenomenon of Ga in the thermally decomposed layer 74 or oxidation of Ga therein, the thickness of the thermally decomposed layer 74 is made nonuniform or the surface shape of the AlGaN layer 73 is made uneven, and variation in the performances of the semiconductor devices ultimately fabricated from the substrate results within the substrate.

Figure 7D:
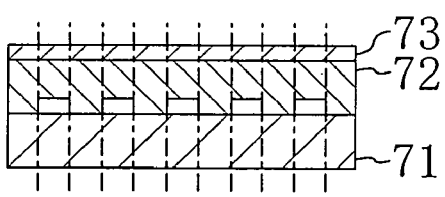

To solve this problem, in the seventh embodiment, the sapphire substrate 71 with the thermally decomposed layer 74 formed by the laser beam irradiation is immersed in, for example, hydrochloric acid to remove the thermally decomposed layers 74 as shown in FIG. 7D. In this process, in order to sequentially remove the thermally decomposed layers 74 from the portion thereof exposed at the edge of the GaN layer 72 toward the substrate center, it is preferable to provide, in forming the thermally decomposed layers 74 shown in FIG. 7C, a bridge pattern which connects the thermally decomposed layers 74 corresponding to the chip formation regions to each other and which is also the thermally decomposed layer. In other words, it is preferable to provide, previously in defining the light-irradiated portions 76 shown in FIG. 7B, a bridge pattern which connects the light-irradiated portions 76 corresponding to the chip formation regions to each other and which is also the light-irradiated portion. Owing to such a provision, hydrochloric acid is supplied even to the portion of the thermally decomposed layer 74 formed around the substrate center, so that all the thermally decomposed layers 74 are removed by etching with hydrochloric acid.

Also in the seventh embodiment, as shown in FIG. 7D, the GaN layer 72 after the removal of the thermally decomposed layer 74 is kept bonded with the sapphire substrate 71 at the portions not irradiated with a laser beam (the portions thereof where no thermally decomposed layer 74 is formed).

Thereafter, although not shown, process steps similar to the first or second embodiment shown in FIGS. 1E to 1G or FIGS. 2E to 2G can be conducted to fabricate, in each of the chip formation regions (the regions corresponding to the light-irradiated portions 76 in FIG. 7B), a semiconductor element using the GaN layer 72 and the AlGaN layer 73 as active layers.

Figure 7E:
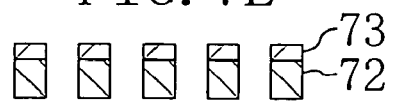

After the semiconductor devices shown in FIG. 7D are fabricated, as shown in FIG. 7E, the sapphire substrate 71 is diced along the dicing lines of the sapphire substrate 71. In other words, the sapphire substrate 71 is split along the linear unirradiated region 75 corresponding to the dicing lines (see FIG. 7B). Thus, a semiconductor element using as active layers portions of the GaN layer 72 and the AlGaN layer 73 located on the region where the thermally decomposed layer 74 has been removed (referred hereinafter to as an upper GaN layer 72) can be separated from the sapphire substrate 71 in such a thin film form that each element can be applied to another substrate.

As described above, in the seventh embodiment, the GaN layer 72 formed on the main surface of the sapphire substrate 71 is irradiated with light from the side of the back surface of the sapphire substrate 71 (the surface of the sapphire substrate 71 opposite to the main surface formed with the GaN layer 72) to form the thermally decomposed layer 74. Therefore, the elasticity of the thermally decomposed layer 74 can relax residual strain within the main surface of the substrate, which avoids problems such as bowing of the sapphire substrate 71.

Furthermore, in the seventh embodiment, part of the GaN layer 72 is thermally decomposed to form the thermally decomposed layer 74. In other words, the back surface of the substrate is partly irradiated with light to form the thermally decomposed layer 74. Therefore, no thermally decomposed layer 74 is formed in the portion of the GaN layer 72 (properly speaking, the region of the GaN layer 72 in contact with the sapphire substrate 71) not irradiated with light. That is to say, even after the removal of the thermally decomposed layer 74, the region of the GaN layer 72 not formed with the thermally decomposed layer 74 is kept bonded directly with the sapphire substrate 71, so that the GaN layer 72 can be kept fixed fully onto the sapphire substrate 71 as the base substrate. This prevents displacement in the position of the GaN layer 72, and then improves the accuracy of subsequent semiconductor element fabrication steps such as a lithography step.

Moreover, in the seventh embodiment, the thermally decomposed layer 74 itself is removed. Therefore, even though, after the removal, the sapphire substrate 71 is heated to a temperature more than the melting point of the thermally decomposed layer 74, contamination, alteration or deformation induced by the heating can be prevented. That is to say, the sapphire substrate 71 can be heated to a temperature more than the melting point of the thermally decomposed layer 74 while contamination, alteration or deformation induced by the heating is prevented.

Moreover, in the seventh embodiment, the GaN layer 72 is irradiated with light so that the light-unirradiated portion 75 is present in linear shape along the dicing line of the sapphire substrate 71, thereby forming the thermally decomposed layer 74. Then, the thermally decomposed layer 74 is removed, and the sapphire substrate 71 is split along the dicing line, that is, along the light-unirradiated portion 75 present in linear shape. Thus, a plurality of semiconductor elements can be individually separated from the sapphire substrate 71. That is to say, in the seventh embodiment, the thermally decomposed layer 74 can be used to relax residual strain within the surface of the sapphire substrate 71 and concurrently to form semiconductor elements. Moreover, each of semiconductor elements can be separated from the sapphire substrate 71 in such a thin film form that the element can be applied to another substrate.

In the seventh embodiment, the type of light applied from the back surface side of the substrate is not limited to a specific light as long as the light can thermally decompose the first semiconductor layer 72.

In the seventh embodiment, the GaN layer is used as the first semiconductor layer 72. However, the first semiconductor layer 72 is not limited to this, and alternatively a group III nitride layer can be used to ensure formation of the thermally decomposed layer 74. It goes without saying that a semiconductor layer other than the group III nitride layer, such as a GaAs layer or a Si layer, may be used instead.

In the seventh embodiment, the sapphire substrate 71 is used, but a SiC substrate, a glass substrate, or the like may be used instead.

In the seventh embodiment, hydrochloric acid is used to remove the thermally decomposed layer 74 by etching, but another acidic solution may be used instead. The thermally decomposed layer 74 may be removed by another technique other than the etching with acidic solution.

In the seventh embodiment, the thickness of the sapphire substrate 71 may be reduced to about 70 µm before the sapphire substrate 71 is diced.

What is claimed is:

1. A method for fabricating a semiconductor device, comprising the steps of:
    forming a thermally decomposed layer by irradiating a semiconductor layer formed on one surface of a substrate with light from the side of the other surface of the substrate to thermally decompose part of a region of the semiconductor layer in contact with the substrate; and
    removing the thermally decomposed layer with the substrate kept bonded with the semiconductor layer,
    wherein in the step of forming a thermally decomposed layer, the thermally decomposed layer is formed only on the perimeter of the one surface of the substrate.

2. The method of claim 1,
    wherein the semiconductor layer is made of group III nitride.

3. The method of claim 1,
    wherein in the step of forming a thermally decomposed layer, the thermally decomposed layer is formed on the one surface of the substrate in a symmetrical shape with respect to the center of the one surface.

4. A method for fabricating a semiconductor device, comprising the steps of:
    forming a thermally decomposed layer by irradiating a semiconductor layer formed on one surface of a substrate with light from the side of the other surface of the substrate to thermally decompose part of a region of the semiconductor layer in contact with the substrate; and
    removing the thermally decomposed layer with the substrate kept bonded with the semiconductor layer,
    wherein in the step of forming a thermally decomposed layer, the thermally decomposed layer is formed on the one surface of the substrate other than the center portion.

5. A method for fabricating a semiconductor device, comprising the steps of:
    forming a thermally decomposed layer by irradiating a semiconductor layer formed on one surface of a substrate with light from the side of the other surface of the substrate to thermally decompose part of a region of the semiconductor layer in contact with the substrate; and
    removing the thermally decomposed layer with the substrate kept bonded with the semiconductor layer,
    wherein in the step of forming a thermally decomposed layer, the thermally decomposed layer is formed concentrically, radially, or spirally on the one surface of the substrate.

6. A method for fabricating a semiconductor device, comprising the steps of:
    forming a thermally decomposed layer by irradiating a semiconductor layer formed on one surface of a substrate with light from the side of the other surface of the substrate to thermally decompose part of a region of the semiconductor layer in contact with the substrate; and
    removing the thermally decomposed layer with the substrate kept bonded with the semiconductor layer,
    wherein in the step of forming a thermally decomposed layer, the thermally decomposed layer is formed to have a portion exposed at an edge of the semiconductor layer, and
    in the step of removing the thermally decomposed layer, the thermally decomposed layer is etched with acidic solution from the exposed portion thereof.

7. A method for fabricating a semiconductor device, comprising the steps of:
    forming a thermally decomposed layer by irradiating a semiconductor layer formed on one surface of a substrate with light from the side of the other surface of the substrate to thermally decompose part of a region of the semiconductor layer in contact with the substrate; and
    removing the thermally decomposed layer with the substrate kept bonded with the semiconductor layer; and
    after the step of removing the thermally decomposed layer, the step of heating the substrate to a temperature more than the melting point of the thermally decomposed layer.

8. A method for fabricating a semiconductor device, comprising the steps of:
    forming a thermally decomposed layer by irradiating a semiconductor layer formed on one surface of a substrate with light from the side of the other surface of the substrate to thermally decompose part of a region of the semiconductor layer in contact with the substrate; and
    removing the thermally decomposed layer with the substrate kept bonded with the semiconductor layer; and
    after the step of removing the thermally decomposed layer, the step of forming a plurality of semiconductor elements using the semiconductor layer as respective active layers.

9. The method of claim 8, further comprising, after the step of forming a plurality of semiconductor elements, the step of splitting the substrate into the plurality of separate semiconductor elements,
    wherein the step of forming a thermally decomposed layer includes the substep of irradiating the semiconductor layer with light along a dicing line of the substrate to form the thermally decomposed layer in linear shape, and
    the step of splitting the substrate includes the substep of splitting the substrate along a linear region where the thermally decomposed layer has been removed.

10. The method of claim 8, further comprising, after the step of forming a plurality of semiconductor elements, the step of splitting the substrate into the plurality of separate semiconductor elements,
    wherein the step of forming a thermally decomposed layer includes the substep of irradiating the semiconductor layer with light so that a region of the substrate not irradiated with the light along a dicing line is present in linear shape, and
    the step of splitting the substrate includes the substep of splitting the substrate along the linear region not irradiated with the light.

* * * * *